United States Patent [19]

Masuda et al.

[11] Patent Number: 4,518,880
[45] Date of Patent: May 21, 1985

[54] MOS SWITCH CIRCUIT WITH CONSISTENT LOW ON RESISTANCE

[75] Inventors: Eiji Masuda, Kawasaki; Kenji Matsuo, Yokohama, both of Japan

[73] Assignee: Tokyo Shibaura Denki Kabushiki Kaisha, Kawasaki, Japan

[21] Appl. No.: 469,971

[22] Filed: Feb. 25, 1983

[30] Foreign Application Priority Data

Feb. 26, 1982 [JP] Japan ................. 57-29938
Feb. 26, 1982 [JP] Japan ................. 57-29966

[51] Int. Cl.³ .............. H03K 17/687; H03K 17/12; H03K 17/04; H03K 17/30
[52] U.S. Cl. .................. 307/577; 307/579; 307/584; 307/585; 307/297
[58] Field of Search .......... 307/296 R, 297, 304, 307/571, 577, 579, 583, 584, 585, 240, 353, 355; 330/9

[56] References Cited

U.S. PATENT DOCUMENTS

| | | | |
|---|---|---|---|
| 3,457,435 | 7/1969 | Burns et al. | 307/585 |
| 3,512,012 | 5/1970 | Kosowsky et al. | 307/304 X |
| 3,558,921 | 1/1971 | Yokozawa et al. | 307/577 |
| 3,866,064 | 2/1975 | Gregory | 307/585 |
| 3,913,026 | 10/1975 | Koehler | 307/304 X |
| 4,020,367 | 4/1977 | Yamashiro et al. | 307/297 |
| 4,093,874 | 6/1978 | Pollitt | 307/577 |
| 4,211,942 | 7/1980 | Aoki et al. | 307/355 |
| 4,327,321 | 4/1982 | Suzuki et al. | 307/297 X |

FOREIGN PATENT DOCUMENTS

45-15883  6/1970  Japan .

OTHER PUBLICATIONS

Thibodeaux, "Getting the Most Out of C-MOS Devices For Analog Switching Jobs"; *Electronics*; pp. 69-74; 12/25/75.

Dingwall, "Monolithic Expandable 6 Bit 20 MHz CMOS/SOS"; IEEE J. Solid-State Circuits, vol. SC-14, pp. 926-932, Dec. 1979.

*Primary Examiner*—Larry N. Anagnos
*Attorney, Agent, or Firm*—Finnegan, Henderson, Farabow, Garrett & Dunner

[57] ABSTRACT

The invention provides an inverting amplifier having a CMOS inverter and a MOSFET, the latter being connected to an input-output path of the CMOS inverter to autozero the CMOS inverter to its toggle point upon being turned on. An output signal from a CMOS inverter which has a short-circuited input-output path is supplied to the back gate of the MOSFET. Even if a gate threshold voltage of the MOSFET varies, its ON resistance is kept substantially constant.

5 Claims, 11 Drawing Figures

F I G. 5
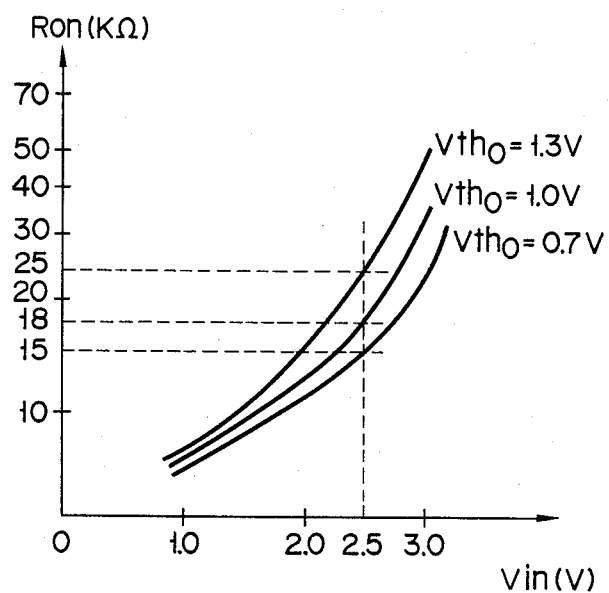
F I G. 6
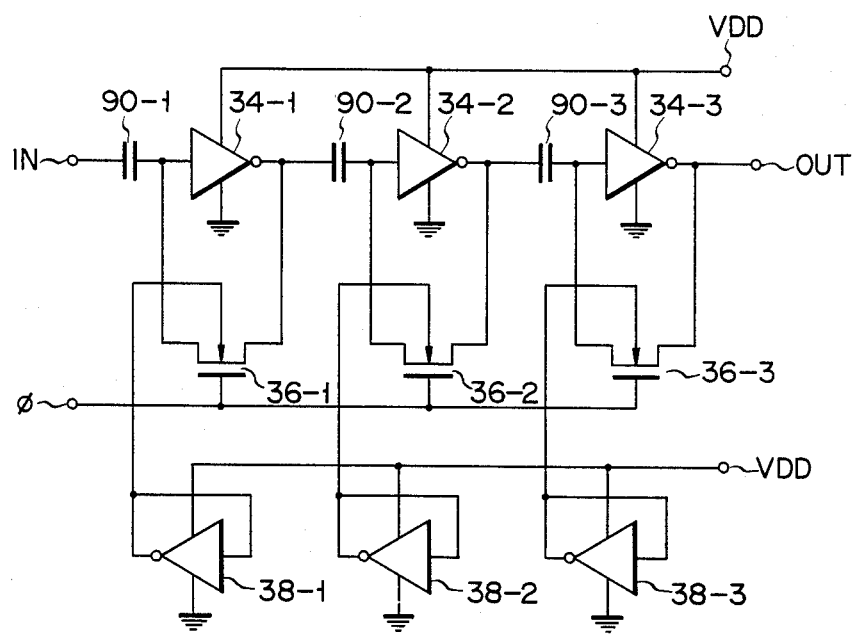

F I G. 10
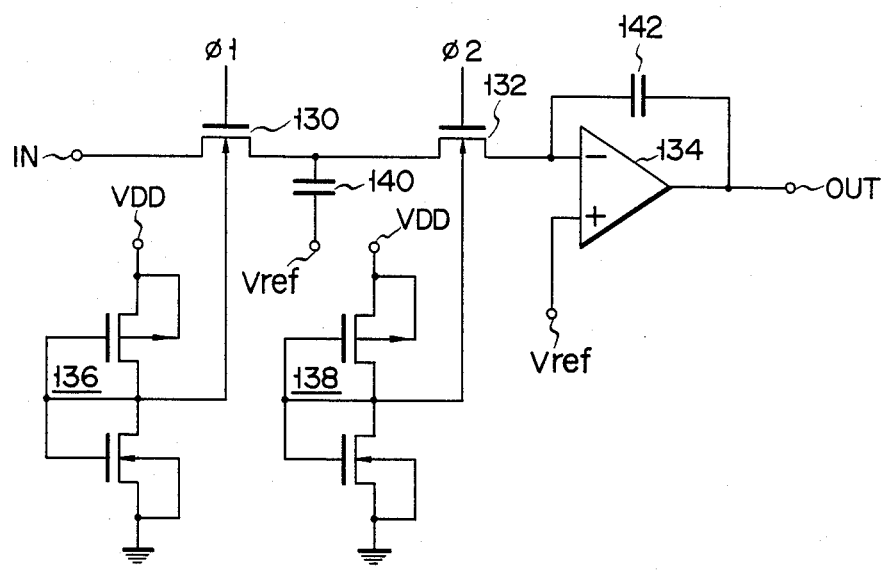
F I G. 11
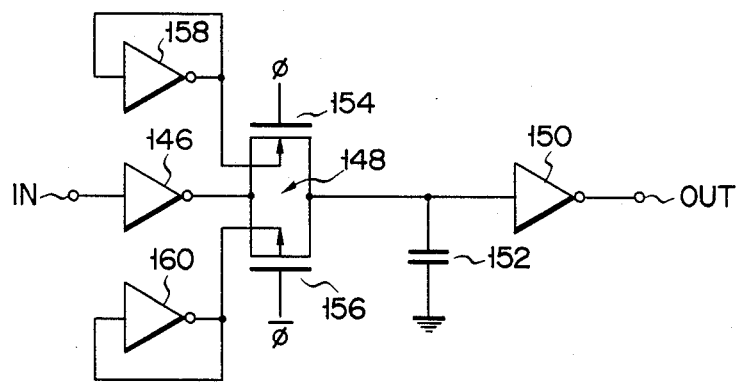

MOS SWITCH CIRCUIT WITH CONSISTENT LOW ON RESISTANCE

BACKGROUND OF THE INVENTION

The present invention relates to an MOS switch circuit for transmitting an analog signal.

Recently, MOS switch circuits have been used in various types of circuits. FIG. 1 shows a circuit diagram of a conventional autozeroed comparator which includes an MOS switch circuit. The autozeroed comparator is described in "Monolithic Expandable 6 bit 20 MHz CMOS/SOS A/D Converter", Andrew G. F. Dingwall, IEEE J. Solid-State Circuits, Vol. SC-14, PP 926–932, December 1979 and is applied to an A/D converter. In the autozeroed comparator of the type described above, a reference signal end VR is connected to one end of a coupling capacitor 12 through an n-channel MOSFET 10 (as an MOS switch). A signal input end VI is also connected to one end of the coupling capacitor 12 through a p-channel MOSFET 14 (as an MOS switch). Clock pulses $\phi$ and $\bar{\phi}$ are supplied to the gates of MOSFETs 10 and 14, respectively. The other end of the coupling capacitor 12 is connected to an output end OUT through a CMOS inverter 16. The CMOS inverter 16 comprises a p-channel MOSFET 18 which is connected to a power source VDD and an n-channel MOSFET 20 which is grounded. An n-channel MOSFET 22 (as an MOS switch) is connected in the input-output path of the CMOS inverter 16. The clock pulse $\phi$ is supplied to the gate of the n-channel MOSFET 22. The back gates of the MOSFETs 10 and 22 are grounded, whereas the back gate of the MOSFET 14 is connected to the power source VDD. In other words, the back gate voltages of the MOSFETs 10, 14 and 22 are constant.

In the comparator of the type described above, the MOSFETs 10 and 22 are ON for the duration of the clock pulse $\phi$. At the same time, the reference voltage VR is supplied to one end of the coupling capacitor 12, and the CMOS inverter 16 is autozeroed to its toggle point. As a result, a potential difference between the reference voltage VR and the toggle voltage ($=\frac{1}{2}$ VDD) of the CMOS inverter 16 appears across the two ends of the capacitor 12. The MOSFETs 10 and 22 are OFF for the duration of the clock pulse $\bar{\phi}$, whereas the MOSFET 14 is ON. Therefore, a voltage corresponding to a difference between the input voltage VI and the reference voltage VR is amplified by the CMOS inverter 16. An amplified voltage appears at the output end OUT. Since such an amplifier comprises only the CMOS inverter and MOS switches, it has a simple configuration and is suitable for circuit integration. As a result, the amplifier of this type is widely used as a basic circuit unit.

High speed operation is generally required for the A/D converter of the type described in the above reference. In order to achieve this end, the operating speed of the amplifier (as one of the slowest circuit elements) must be increased. More particularly, the time interval within which the MOSFET 22 of the amplifier is turned on and then the CMOS inverter 16 is completely autozeroed must be shortened. However, in the prior art, the single MOSFET 22 is used as an MOS switch, so that a ground voltage VSS (=0) is applied to the back gate. For this reason, when an input voltage of the CMOS inverter 16 is increased, a back gate bias effect occurs, thus increasing the ON resistance of the MOSFET 22. As a result, it takes a long time interval for the CMOS inverter 16 to be autozeroed to its toggle point.

A channel width is conventionally increased to decrease the ON resistance of the MOSFET, even though this decreases the integrating density of the element. However, when the channel width of the MOSFET is increased, parasitic capacitances between the gate and source electrodes and between the gate and drain electrode are increased. As a result, the clock pulse $\phi$ leaks from the gate to the source and drain through the parasitic capacitances in accordance with a "field through" phenomenon, thereby increasing an offset voltage in the input-output path of the CMOS inverter 16. The offset voltage is one of the most important electrical characteristics, and preferably should not be increased. Therefore, it is preferred that the channel width (i.e., element size) of the MOSFET be smaller; thus an increase in channel width in favor of a decrease in ON resistance is not preferred in practice.

The ON resistance of a MOSFET is in proportion to a gate threshold voltage thereof. In general, an intrinsic MOS threshold voltage $Vth_o$ varies during various manufacturing processes. It is very difficult to keep the ON resistance at a constant small value. The gate threshold voltage of the MOSFET generally varies within a range of $\pm 0.3$ V. In particular, when the intrinsic MOS threshold voltage of the n-channel MOSFET is increased, the ON resistance thereof is greatly increased as compared with the p-channel MOSFET. FIG. 2 is a graph for explaining the ON resistance $R_{on}$ as a function of the input voltage (a voltage applied to the source or drain electrode) $V_{in}$, using the intrinsic MOS threshold voltage $Vth_o$ as a parameter. FIG. 2 shows a case in which only a voltage of 5.0 V is applied to the gate electrode of the n-channel MOSFET in which W/L (the ratio of channel width W to channel length L) is 6/7 on the mask. Referring to FIG. 2, when the intrinsic MOS threshold voltage $Vth_o$ is 1.0 V, the ON resistance is 28 k$\Omega$. When the intrinsic MOS threshold voltage $Vth_o$ is decreased by 0.3 V, the ON resistance is decreased to 19 k$\Omega$. However, when the intrinsic MOS threshold voltage is increased by 0.3 V, the ON resistance is greatly increased to 65 k$\Omega$. In short, when the intrinsic MOS threshold voltage $Vth_o$ is increased or decreased by the same voltage with respect to a given value, the ON resistance is increased more when the intrinsic MOS threshold voltage $Vth_o$ is increased than it is decreased when the intrinsic MOS threshold voltage $Vth_o$ is decreased.

As may be apparent from the above description, the conventional MOS switch circuit which uses MOSFETs fails to keep the ON resistance constant at a small value thereof. The variation in ON resistance also results in a disadvantage when an MOS switch circuit is used in place of the resistor in a switched-capacitor delay circuit. In other words, variation in ON resistance causes variation in delay time.

SUMMARY OF THE INVENTION

It is an object of the present invention to provide an MOS switch circuit which has a low and constant ON resistance.

In order to achieve the above object of the present invention, there is provided an MOS switch circuit, comprising: an MOS transistor which has gate and back gate electrodes; and a bias circuit for applying a voltage in proportion to a threshold voltage of the MOS transistor to the back gate electrode of the MOS transistor.

BRIEF DESCRIPTION OF THE DRAWINGS

FIG. 5 is a graph for explaining the ON resistance $R_{on}$ as a function of the input voltage $V_{in}$, using the intrinsic MOS threshold voltage as a parameter;

FIG. 6 is a circuit diagram of a modification of the first embodiment shown in FIG. 3;

FIGS. 10 and 11 are circuit diagrams of other modifications of the present invention.

DETAILED DESCRIPTION OF THE PREFERRED EMBODIMENTS

Figure 3:
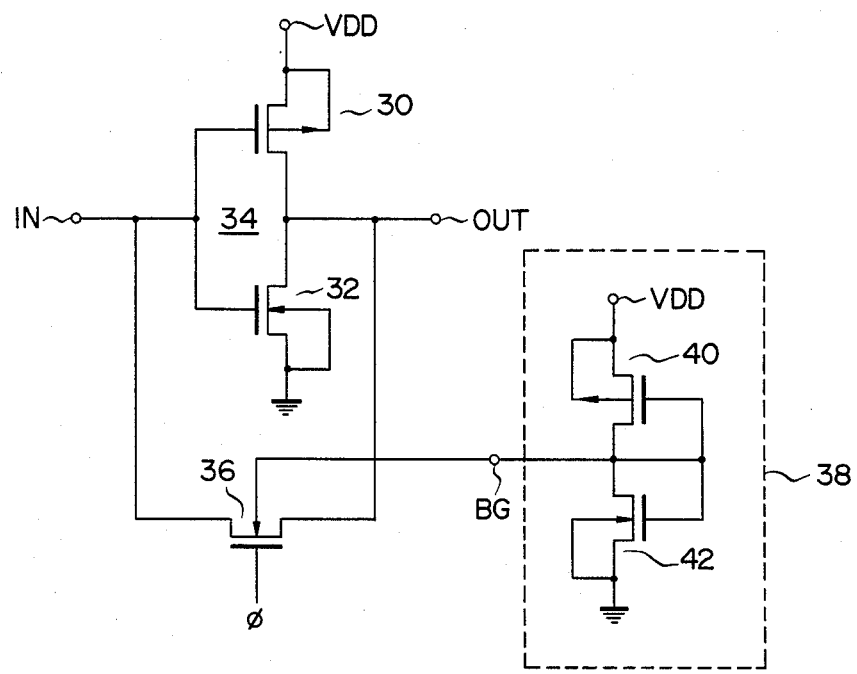
FIG. 3 is a circuit diagram of an MOS switch circuit used as an amplifier according to a first embodiment of the present invention.

An MOS switch circuit according to a first embodiment of the present invention will be described with reference to the accompanying drawings. FIG. 3 is a circuit diagram of the MOS switch circuit as an inverting amplifier according to the first embodiment of the present invention. A CMOS inverter 34 comprises a p-channel MOSFET 30 and an n-channel MOSFET 32 and is connected between a power source VDD and a ground. The p-channel MOSFET 30 is connected to the power source VDD, and the n-channel MOSFET 32 is grounded. More particularly, the back gate of the p-channel MOSFET 30 is connected to the power source VDD, and the back gate of the n-channel MOSFET 32 is grounded. An n-channel MOSFET 36 (as an MOS switch) is connected in the input-output path of the CMOS inverter 34. A clock pulse $\phi$ as a control signal is supplied to the gate of the n-channel MOSFET 36. The back gate of the n-channel MOSFET 36 is connected to an output end BG of a bias circuit 38. The bias circuit 38 comprises a CMOS inverter which is connected between the power source VDD and ground. This CMOS inverter comprises a p-channel MOSFET 40 which is connected to the power source VDD and an n-channel MOSFET 42 which is grounded. The output and input ends of the CMOS inverter are commonly connected such that its common node is connected to the output end BG of the bias circuit 38. The back gate of the p-channel MOSFET 40 is connected to the power source VDD, whereas the back gate of the n-channel MOSFET 42 is grounded. The n-channel MOSFET 36 and the bias circuit 38 constitute an MOS switch circuit according to the first embodiment of the present invention.

Figure 4:
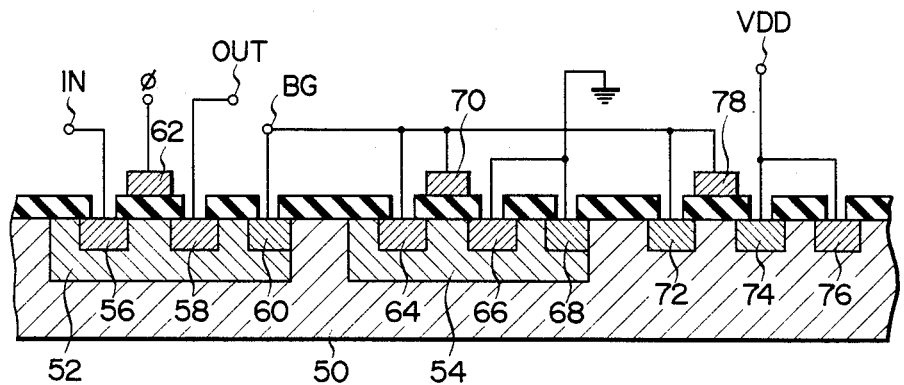
FIG. 4 is a sectional view showing the MOS switch and part of a bias circuit of the MOS switch circuit shown in FIG. 3.

FIG. 4 is a sectional view showing a detailed element structure of the n-channel MOSFET 36 and the bias circuit 38. Two p-type well regions 52 and 54 are formed in an n-type semiconductor substrate 50 and respectively correspond to prospective element regions of the n-channel MOSFETs 36 and 42. N+-type regions 56 and 58 and a p+-type region 60 are formed in the p-type well region 52. The n+-type regions 56 and 58 correspond to the source and drain of the MOSFET 36. The p+-type region 60 corresponds to a contact region for the back gate of the MOSFET 36. The n+-type regions 56 and 58 are connected to an input end IN and an output end OUT, respectively, of the CMOS inverter 34. A gate electrode 62 is formed on a surface portion of the p-type well region 52 through an insulating film. This surface portion corresponds to a portion between the n+-type regions 56 and 58. The clock pulse $\phi$ is supplied to the gate electrode 62. N+-type regions 64 and 66 and a p+-type region 68 are formed in the p-type well region 54. The n+-type regions 64 and 66 correspond to the source and drain of the MOSFET 42, respectively, and the p+-type region 68 corresponds to a contact region for the back gate of the MOSFET 42. The n+-type region 66 and the p+-type region 68 are grounded. A gate electrode 70 is formed on a surface portion of the p-type well region 54 through an insulating film. This surface portion corresponds to a portion between the n+-type regions 64 and 66. P+-type regions 72 and 74 and an n+-type region 76 are formed in the n-type semiconductor substrate 50. The p+-type regions 72 and 74 correspond to the source and drain, respectively, of the MOSFET 40 of the bias circuit 38. The n+-type region 76 corresponds to a contact region for the back gate of the MOSFET 40. A gate electrode 78 is formed on a surface portion of the n-type semiconductor substrate 50 through an insulating film. This surface portion corresponds to a portion between the p+-type regions 72 and 74. The p+-type region 74 and the n+-type region 76 are connected to the power source VDD. The n+-type region 64, the gate electrode 70, the p+-type region 72 and the gate electrode 78 are commonly connected to the output end BG. The output end BG is then connected to the contact region 60 (i.e., the back gate of the MOSFET 36).

The mode of operation of the MOS switch circuit described above will be described hereinafter. The bias circuit 38 causes the input-output path of the CMOS inverter to short-circuit, so that an output therefrom is equal to a logical threshold voltage Vthc of the CMOS inverter expressed as follows:

$$V_{thc} = \{V_{thn} + \sqrt{K_p/K_n}\,(VDD - |V_{thp}|)\}/(1 + \sqrt{K_p/K_n}) \quad (1)$$

where Vthp and Vthn are the gate threshold voltages of the p-channel MOSFET 40 and the n-channel MOSFET 42, respectively, and Kp and Kn are the coefficients of drain currents $I_{DS}$ of the MOSFETs 40 and 42, respectively. The coefficients Kp and Kn are given by the following equations:

$$K_p = (\tfrac{1}{2}) \cdot (W_p/L_p) \cdot (\epsilon_{ox}/t_{ox}) \cdot \mu_p \quad (2)$$

$$K_n = (\tfrac{1}{2}) \cdot (W_n/L_n) \cdot (\epsilon_{ox}/t_{ox}) \cdot \mu_n \quad (3)$$

where Wp and Wn are the channel widths of the MOSFETs 40 and 42, respectively; Lp and Ln are the channel lengths thereof, respectively; $t_{ox}$ is the thickness of the gate insulating film; $\epsilon_{ox}$ is the dielectric constant of the gate insulating film; and $\mu_p$ and $\mu_n$ are the carrier mobilities of holes and electrons, respectively.

As may be apparent from equations (1) to (3), the logical threshold voltage Vthc of the CMOS inverter, that is, the back gate voltage of the n-channel MOSFET 36, can be arbitrarily set between the power source voltage VDD and the ground voltage VSS in accordance with the channel widths and lengths of the MOSFETs 40 and 42 of the bias circuit 38.

The gate threshold voltage Vth of a MOSFET is generally given by the following equation:

$$Vth = Vth_o + (t_{ox}/\epsilon_{ox})\sqrt{2q\epsilon_s N}\ (\sqrt{2\phi_F + VBS} - \sqrt{2\phi_F}) \quad (4)$$

where VBS is the voltage between the source electrode and the substrate electrode (back gate electrode), $Vth_o$ is the intrinsic MOS threshold voltage when the voltage VBS is zero, $\epsilon_s$ is the dielectric constant of silicon, q is the electron charge, N is the impurity concentration of the substrate, and $\phi_F$ is the Fermi level.

As may be apparent from equation (4), when either the voltage VBS between the source and the back gate or the intrinsic MOS threshold voltage $Vth_o$ is increased, the gate threshold voltage Vth is also increased. Since the ON resistance $R_{on}$ is expressed by the following equation, it is increased when the gate threshold voltage Vth is increased:

$$R_{on} \propto 1/(VGS-Vth) \quad (5)$$

where VGS is the voltage between the gate electrode and the source electrode.

As may be seen from equations (4) and (5), in order to decrease the ON resistance of the MOSFET 36, it is found that the gate threshold voltage Vth of the MOSFET 36 must be decreased. Furthermore, in order to decrease the gate threshold voltage Vth, the voltage VBS must be decreased on the basis of equation (4). In other words, the voltage between the source electrode and the back gate electrode must be decreased. For this reason, the back gate voltage (the output voltage Vthc of the bias circuit 38) is preferably high in accordance with equation (1). When only the ON resistance is considered, the back gate voltage is set to be the same as the power source voltage VDD.

The current consumption of the n-channel MOSFET 36 increases in accordance with an increase in the back gate voltage. This is because p-n junctions are formed between the back gate electrode and the source electrode and between the back gate electrode and the drain electrode. When the power source voltage VDD is applied to the back gate of the n-channel MOSFET 36, a current constantly flows from the back gate electrode to the source and drain electrodes, thus greatly increasing the current consumption. Therefore, the output voltage of the bias circuit 38 (i.e., the back gate voltage of the MOSFET 36) is in practice set to be an intermediate optimum value between the power source voltage VDD and the ground voltage VSS, which takes into consideration both the ON resistance and the current consumption. That is, the logical threshold voltage Vthc of the CMOS inverter including the p-channel MOSFET 40 and the n-channel MOSFET 42 is set to the voltage between the power source voltage VDD and the ground voltage VSS.

The bias circuit 38 of the MOS switch circuit according to the first embodiment of the present invention also provides the following effects. The n-channel MOSFET 36 (as an MOS switch) and the n-channel MOSFET 42 of the bias circuit 38 are manufactured by the same process. The intrinsic MOS threshold voltages $Vth_o$ of the MOSFETs 36 and 42 are thus the same. This indicates that the gate threshold voltage Vthn of the n-channel MOSFET 42 varies in the positive direction and the output voltage of the bias circuit 38 is increased in accordance with equation (1), even if the gate threshold voltage of the n-channel MOSFET 36 varies in the positive direction and the ON resistance is increased. As a result, the back gate voltage of the n-channel MOSFET 36 is increased, whereas the gate threshold voltage is decreased and hence the ON resistance is decreased. This indicates that an increase in the intrinsic MOS threshold voltage does not greatly influence the ON resistance. However, when the intrinsic MOS threshold voltage of the MOSFET 36 varies in the negative direction, the ON resistance is decreased. This result is preferable only from the viewpoint of the response speed of the CMOS inverter, but is not preferable from the viewpoint of the stability of the ON resistance. The output voltage of the bias circuit 38 is decreased, so that the ON resistance is increased. As a result, the ON resistance does not vary significantly.

Figure 1:
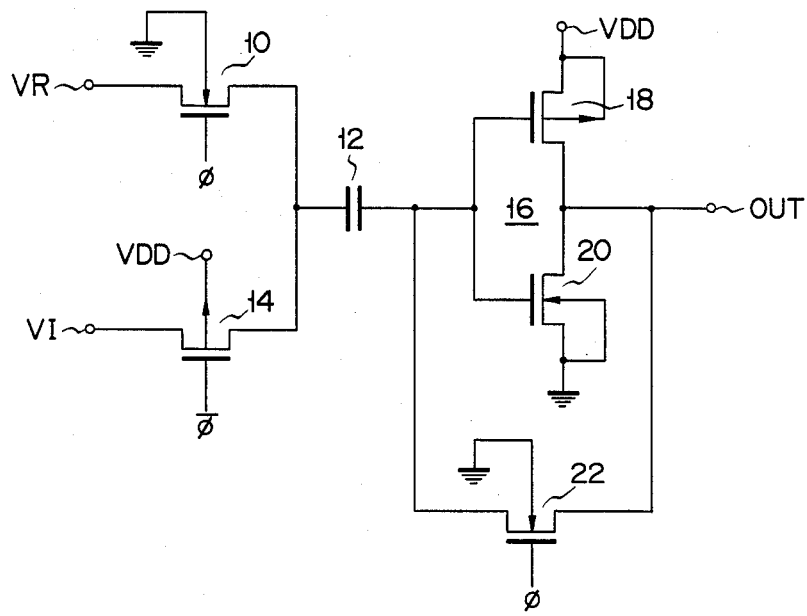
FIG. 1 is a circuit diagram of a conventional amplifier.
Figure 2:
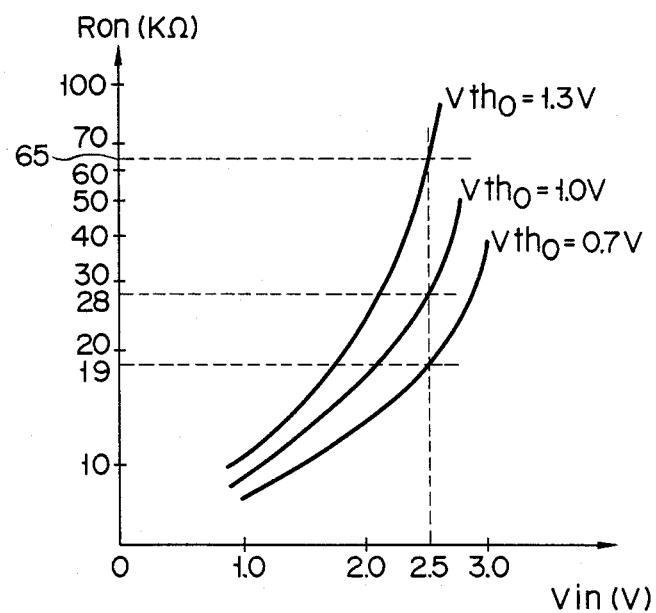
FIG. 2 is a graph for explaining the ON resistance $R_{on}$ as a function of the input voltage $V_{in}$, using as a parameter the intrinsic MOS threshold voltage of the MOS switch.

FIG. 5 is a graph for explaining the ON resistance $R_{on}$ of the MOSFET 36 as a function of the input voltage $V_{in}$, using the intrinsic MOS threshold voltage $Vth_o$ as a parameter. Referring to FIG. 5, the input voltage $V_{in}$ is plotted along the axis of the abscissa, and the ON resistance of the MOSFET 36 is plotted along the axis of the ordinate. The W/L (the ratio of the channel width W to the channel length L) is set to be 6/7 on the mask, and the gate voltage of the MOSFET 36 is set at a voltage of 5.0 V. The W/L of the p-channel MOSFET 40 of the bias circuit 38 is 6/42 on the mask; the W/L of the n-channel MOSFET 42 is 35/7 on the mask. Assume that the input voltage $V_{in}$ is 2.5 V. When the intrinsic MOS threshold voltages are 0.7 1 V, 1.0 V and 1.3 V, the ON resistances are 15 kΩ, 18 kΩ, and 25 kΩ, respectively, from FIG. 5. These ON resistances are significantly small as compared with the conventional case in which the ON resistances are 19 kΩ, 28 kΩ, and 65 kΩ as shown in FIG. 2. Even if the intrinsic MOS threshold voltages vary in accordance with various manufacturing processes (i.e., even if the output voltage Vthc of the bias circuit 38 varies), the changes in ON resistances are greatly decreased as compared with those of the conventional circuit.

According to the embodiment described above, an MOS switch circuit which has a low and constant ON resistance is obtained by applying a voltage corresponding to the gate threshold voltage of the MOSFET to the back gate of the MOSFET (as the MOS switch). When the MOS switch circuit of this type is used, a high-speed amplifier can be obtained which has a high integrating density and eliminates any offset.

FIG. 6 shows a modification of the MOS switch circuit of FIG. 3. More particularly, FIG. 6 shows a high-gain amplifier in which the three inverting amplifiers shown in FIG. 3 are cascade-connected. Coupling capacitors 90-1, 90-2 and 90-3 are connected to input ends of CMOS inverters 34-1, 34-2 and 34-3, respectively. The power source voltage VDD is set to be 5.0 V, and the output voltages of bias circuits 38-1, 38-2 and 38-3 are respectively set within ranges of 2.0 to 2.5 V, 1.5 to 2.0 V and 1.2 to 1.5 V. The amplifier disposed nearer to the input end IN and dealing with a smaller signal has a smaller ON resistance and obtains a higher operating speed.

Figure 7:
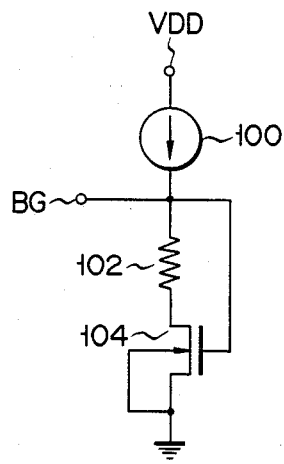
FIGS. 7 and 8 are circuit diagrams of bias circuits of MOS switch circuits according to second and third embodiments of the present invention, respectively.

A bias circuit of an MOS switch circuit according to a second embodiment of the present invention will be described with reference to FIG. 7. A constant current source 100 is connected between a power source VDD and an output end BG. A series circuit of a resistor 102 and an n-channel MOSFET 104 is connected between the output end BG and ground. The gate of the MOSFET 104 is connected to the output end BG, and the back gate thereof is grounded. The output end BG is connected to the back gate of the n-channel MOSFET 36 (FIG. 3).

In the bias circuit of the type described above, the output voltage is determined to be an intermediate optimum value between the power source voltage VDD and the ground voltage VSS in accordance with an output current I of the constant current source 100, the resistance of the resistor 102 and the element size of the MOSFET 104. If the gate threshold voltage of a MOSFET 104 is defined as $Vth_{102}$, an output voltage therefrom is $V_o$, the output current of the constant current source 100 is I, and the resistance of the resistor 102 is 0, the following equation is given:

$$I = K(V_o - Vth_{102})^2 \qquad (6)$$

where k is the proportional constant.

Equation (6) indicates that the output voltage $V_o$ increases or decreases with an increase or decrease, respectively, in the gate threshold voltage of the MOSFET 104 (or the MOSFET 36). Therefore, the bias circuit shown in FIG. 7 has a low and constant ON resistance with respect to a change in the threshold voltage of the MOSFET (as an MOS switch) in the same manner as in the first embodiment. It is noted the resistor 102 is included so as to produce an output voltage $V_o$ obtained by adding a constant voltage to a source-drain voltage of the MOSFET 104.

Figure 8:
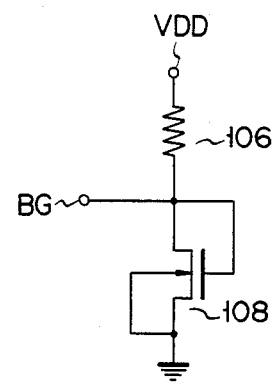

FIG. 8 shows a bias circuit of an MOS switch circuit according to a third embodiment of the present invention. A resistor 106 is connected between the power source VDD and an output end BG. An n-channel MOSFET 108 is connected between the output end BG and a ground. The gate of the MOSFET 108 is connected to the output end BG, and the back gate thereof is grounded. The output end BG is then connected to the back gate of the n-channel MOSFET 36.

In the bias circuit of the type described above, if a gate threshold voltage of the MOSFET 108 is defined as $Vth_{108}$, the output voltage $V_o$ is expressed as follows:

$$V_o = Vth_{108}/K \qquad (7)$$

where K is the proportional constant.

According to equation (7), it is established that the output voltage $V_o$ is proportional to the gate threshold voltage of the MOSFET 104 (i.e., the gate threshold voltage of the MOSFET 36). The circuit of the third embodiment can also provide the same effect as in the above-mentioned embodiments.

In the three embodiments described above, n-channel MOS switches are used. However, a p-channel MOS switch can also be used. In this case, the two voltage ends of the bias circuit must be reversed; one end connected to the power source VDD must then be grounded, and the other end grounded must then be connected to the power source VDD.

Figure 9:
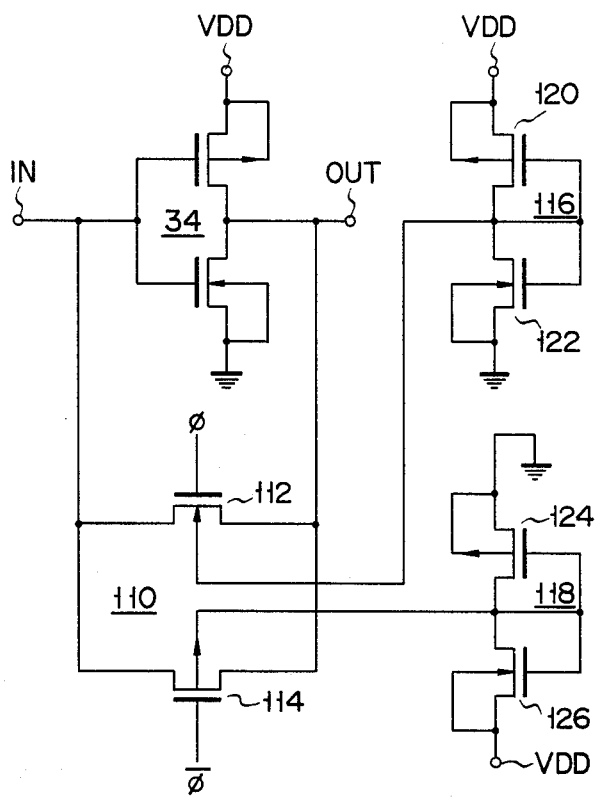
FIG. 9 is a circuit diagram of an MOS switch circuit as an amplifier according to a fourth embodiment of the present invention.

FIG. 9 is a circuit diagram of a circuit according to a fourth embodiment of the present invention. In this circuit, a CMOSFET 110 is used as a MOS switch. A parallel circuit of an n-channel MOSFET 112 and a p-channel MOSFET 114 is connected in an input-output path of the CMOS inverter 34. The MOSFETs 112 and 114 constitute the CMOSFET 110. Clock pulses $\phi$ and $\bar{\phi}$ are supplied to the gate electrodes of the MOSFETs 112 and 114, respectively. The bias circuit comprises CMOS inverters 116 and 118 which respectively have short-circuited input-output paths. In the CMOS inverter 116, a p-channel MOSFET 120 is connected to the power source VDD, and an n-channel MOSFET 122 is grounded. The output end of the CMOS inverter 116 is connected to the back gate of the n-channel MOSFET 112. The CMOS inverter 118 comprises a p-channel MOSFET 124 which is grounded and an n-channel MOSFET 126 which is connected to the power source VDD. The output end of the CMOS inverter 118 is connected to the back gate of the p-channel MOSFET 114.

In the circuit of the type described above, voltages corresponding to the gate threshold voltages of the n-channel MOSFET 112 and the p-channel MOSFET 114 are respectively supplied thereto, so that the ON resistances thereof are kept constant and low.

An MOS switch circuit applied to electrical circuits except for the voltage amplifier will now be described. FIG. 10 shows a MOS switch circuit as a switched-capacitor integrator. An input end IN is connected to the non-inverting input end of an operational amplifier 134 through a series circuit of n-channel MOSFETs 130 and 132. Clock pulses $\phi 1$ and $\phi 2$ are supplied to the gates of the MOSFETs 130 and 132, respectively. Bias circuits 136 and 138 which comprise CMOS inverters having short-circuited input-output paths are connected to the back gates of the MOSFETs 130 and 132, respectively. The MOSFET 130 is turned on in response to the first clock pulse $\phi 1$, so that an input signal is charged in a capacitor 140. The MOSFET 130 is turned off in response to the second clock pulse $\phi 2$, so that the capacitor 140 is discharged. The signal discharged from the capacitor 140 through the MOSFET 132 is integrated by an integrator which comprises the operational amplifier 134 and a capacitor 142. The MOSFETs 130 and 132 function as resistive elements. When the resistances of the resistive elements are large, the capacitance ratio of the integrator is decreased. Therefore, the resistances of the resistive elements are preferably small. When the bias circuits 136 and 138 are connected to the back gates of the MOSFETs 130 and 132, respectively, the ON resistances of the MOSFETs can be made small.

FIG. 11 shows a case in which MOS switches are used as resistive elements for a delay circuit. An input end IN is connected to an output end OUT through a series circuit of a CMOS inverter 146, a CMOSFET 148 (as a resistive element), and a CMOS inverter 150. A capacitor 152 is connected to a node between the CMOSFET 148 and the CMOS inverter 150. The CMOSFET 148 comprises an n-channel MOSFET 154 and a p-channel MOSFET 156. Bias circuits 158 and 160 which are the same as the bias circuits 116 and 118 shown in FIG. 9 are connected to the back gates of the MOSFETs 154 and 156, respectively.

In the delay circuit of the type described above, since delay time is determined in accordance with the time constant (CR), the ON resistance of the resistive element is preferably kept constant by the bias circuits 158 and 160.

In summary, according to the present invention, the back gate bias voltage is changed in accordance with a change in the threshold voltage of the MOSFET, so that the MOS switch circuit having a constant ON resistance can be obtained. This MOS switch circuit can be applied to any other circuit as well as to the above-mentioned circuits.

What we claim is:

1. An MOS switch circuit with low ON resistance with low-variation, which comprises:
    a first MOS transistor switch having source and drain electrodes connected to input and output terminals of the switch circuit, respectively, and also having gate and back gate electrodes, the on/off state of the first MOS transistor switch being controlled by a control signal supplied to the gate electrode thereof; and
    biasing means, including a second MOS transistor switch having a channel type the same as the channel type of the first MOS transistor switch, for supplying a voltage corresponding to a threshold voltage of the second MOS transistor switch to the back gate of the first MOS transistor switch.

2. A circuit according to claim 1, in which said biasing means is a CMOS inverter having output and input terminals, the CMOS inverter being formed of the second MOS transistor switch and a third MOS transistor switch having a channel type opposite to the channel type of the second MOS transistor switch, the second and the third MOS transistor switches being connected in series between first and second reference voltage terminals, the output terminal and the input terminal of the CMOS inverter being short-circuited and connected to the back gate of the first MOS transistor switch.

3. A circuit according to claim 1, in which said biasing means comprises a series combination of a constant current source and the second MOS transistor switch connected between first and second reference voltage terminals, the gate of the second MOS transistor switch being connected to the junction between the constant current source and the second MOS transistor switch and further connected to the back gate of the first MOS transistor switch.

4. A circuit according to claim 3, in which said constant current source is a resistor.

5. A circuit according to claim 1, wherein said first MOS transistor switch comprises a CMOS transistor switch formed of a MOSFET, and said biasing means comprises two CMOS inverters each formed of the second MOS transistor switch and a third MOS transistor switch which has a channel type opposite to the channel type of the second MOS transistor switch, the second and the third MOS transistor switches being connected in series between first and second reference voltage terminals, the output and input terminals of the CMOS inverter being short-circuited and connected to the back gate of the MOSFET.

* * * * *